United States Patent
Chung et al.

(10) Patent No.: US 11,001,676 B2
(45) Date of Patent: May 11, 2021

(54) SUPRAMOLECULAR STRUCTURE AND METHOD OF MANUFACTURING THE SAME AND SELF-HEALING ELASTOMER

(71) Applicants: Foundation of Soongsil University-Industry Cooperation, Seoul (KR); KOREA INSTITUTE OF SCIENCE AND TECHNOLOGY, Seoul (KR)

(72) Inventors: Jae Woo Chung, Seoul (KR); Junhaeng Lee, Seoul (KR); Seayoung Lim, Ansan-si (KR); Sunghoon Jung, Incheon (KR); Yong Chae Jung, Jeollabuk-do (KR); Seokhoon Ahn, Jeollabuk-do (KR)

(73) Assignees: KOREA INSTITUTE OF SCIENCE AND TECHNOLOGY, Seoul (KR); FOUNDATION OF SOONGSIL UNIVERSITY-INDUSTRY COOPERATION, Seoul (KR)

( * ) Notice: Subject to any disclaimer, the term of this patent is extended or adjusted under 35 U.S.C. 154(b) by 201 days.

(21) Appl. No.: 16/185,011

(22) Filed: Nov. 9, 2018

(65) Prior Publication Data

US 2020/0079914 A1 Mar. 12, 2020

(30) Foreign Application Priority Data

Sep. 6, 2018 (KR) ........................ 10-2018-0106679

(51) Int. Cl.
| | |
|---|---|
| *C08G 83/00* | (2006.01) |
| *H01L 27/32* | (2006.01) |
| *H01L 51/00* | (2006.01) |
| *G02F 1/1333* | (2006.01) |
| *H01L 51/52* | (2006.01) |

(52) U.S. Cl.
CPC ........ *C08G 83/008* (2013.01); *G02F 1/13338* (2013.01); *G02F 1/133305* (2013.01); *H01L 27/323* (2013.01); *H01L 51/0097* (2013.01); *H01L 51/524* (2013.01); *H01L 2251/5338* (2013.01)

(58) Field of Classification Search
CPC ........................... C08G 83/008; C08G 2270/00
See application file for complete search history.

(56) References Cited

U.S. PATENT DOCUMENTS

| | | | | |
|---|---|---|---|---|
| 7,838,621 | B2 * | 11/2010 | Janssen | A61K 8/87 528/327 |
| 2020/0253192 | A1 * | 8/2020 | Jiang | A61K 8/042 |

FOREIGN PATENT DOCUMENTS

| | | |
|---|---|---|
| JP | 2007522261 A | 8/2007 |
| JP | 2017527669 A | 9/2017 |
| KR | 101276693 B1 | 6/2013 |
| KR | 1020170114757 A | 10/2017 |
| KR | 101812238 B1 | 12/2017 |
| WO | 2018028365 A1 | 2/2018 |

OTHER PUBLICATIONS

Varshey et al.; "Supramolecular Interactions"; Supramolecular Chemistry: From Molecules to Nanomaterials, John Wiley & Sons, Ltd.; pp. 1-16. (Year: 2012).*
Hao Wen et al., "Development of humidity-responsive self-healing zwitterionic polyurethanes for renewable shape memory applications," RSC Advances, Jun. 2017, pp. 31525-31534, vol. 7, The Royal Society of Chemistry.
He Liu et al., "Zwitterionic copolymer-based and hydrogen bonding-strengthened self-healing hydrogel," RSC Advances, Apr. 2015, vol. 5, pp. 33083-33088, The Royal Society of Chemistry.
M. Fleischer et al., "Transforming polyethylenimine into a pH-switchable hydrogel by additional supramolecular interactions," Chem.Commun., 2014, pp. 10464-10467, The Royal Society of Chemistry.
Patricia Y.W. Dankers et al., "Chemical and biological properties of supramolecular polymer systems based on oligocaprolactones," Biomaterials, 2006, pp. 5490-5501, vol. 27, Elsevier Ltd.
Tao Bai et al., "Zwitterionic fusion in hydrogels and spontaneous and time-independent self-healing under physiological conditions," Biomaterials, Apr. 2014, pp. 3926-3933, vol. 35, Elsevier Ltd.
Zhao Wei et al., "Self-healing gels based on constitutional dynamic chemistry and their potential applications," Chem. Soc. Rev., 2014, 18 pages, The Royal Society of Chemistry.
Min Wei et al., "Novel Poly(tetramethylene ether)glycol and Poly(ε-caprolactone) Based Dynamic Network via Duadruple Hydrogen Bonding with Triple-Shape Effect and Self-Healing Capacity", ACS Appl. Mater. Interfaces, Jan. 5, 2015, pp. 2585-2596, American Chemical Society.
Satu Strandman et al., "Self-Healing Supramolecular Hydrogels Based on Reversible Physical Interactions", Gels, 2016, 31 pages.

* cited by examiner

*Primary Examiner* — Michael J Feely
(74) *Attorney, Agent, or Firm* — Cantor Colburn LLP

(57) ABSTRACT

Disclosed are a supramolecular structure including a plurality of first oligomers having a zwitterion at the terminal end and a plurality of second oligomers having a hydrogen-bondable functional group at the terminal end, wherein a supramolecule including the plurality of first oligomers and a supramolecule including the plurality of second oligomers form a three-dimensional network structure, and a method of manufacturing the same, a self-healing elastomer, a self-healing film, and an electronic device.

19 Claims, 14 Drawing Sheets

SUPRAMOLECULAR STRUCTURE AND METHOD OF MANUFACTURING THE SAME AND SELF-HEALING ELASTOMER

CROSS-REFERENCE TO RELATED APPLICATION

This application claims priority to and the benefit of Korean Patent Application No. 10-2018-0106679 filed in the Korean Intellectual Property Office on Sep. 6, 2018, the entire contents of which are incorporated herein by reference.

BACKGROUND

1. Field

A supramolecular structure, a method of manufacturing the same, and a self-healing elastomer are disclosed.

2. Description of the Related Art

According to generalizing an electronic device such as a smart phone or a tablet PC, the various ways for protecting the electronic device from damages caused by external force have been researched. As one of them, a self-healing system may be exemplified. The self-healing system means a system capable of sensing the damage region and self-healing the same when damage such as scratch is occurred.

However, structures having the self-healing system are mostly soft materials, and thus have insufficient mechanical characteristics.

SUMMARY

An embodiment provides a supramolecular structure capable of satisfying self-healing characteristics and mechanical characteristics simultaneously.

Another embodiment provides a method of manufacturing the supramolecular structure.

Another embodiment provides a self-healing elastomer including the supramolecular structure.

Another embodiment provides a self-healing film including the self-healing structure.

Another embodiment provides an electronic device including the self-healing film.

According to an embodiment, a supramolecular structure includes a plurality of first oligomers having a zwitterion at the terminal end and a plurality of second oligomers having a hydrogen-bondable functional group at the terminal end, wherein a supramolecule comprising the plurality of first oligomers and a supramolecule comprising the plurality of second oligomers are interpenetrated to form a three-dimensional network structure.

The first oligomers may be a non-linear oligomer and the second oligomers may be a linear oligomer.

The zwitterion may be positioned at each terminal end of the non-linear oligomer and the hydrogen-bondable functional group may be positioned at both terminal ends of the linear oligomer.

The first oligomers may have a quaternary carbon structure.

The first oligomers may be represented by Chemical Formula 1.

[Chemical Formula 1]

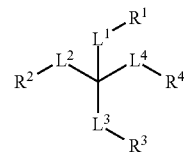

In Chemical Formula 1, $L^1$ to $L^4$ are independently a single bond or a substituted or unsubstituted C1 to C10 alkylene group, and $R^1$ to $R^4$ are independently a substituted or unsubstituted C1 to C10 alkyl group, a substituted or unsubstituted C6 to C30 aryl group, or a group represented by Chemical Formula A, provided that at least one of $R^1$ to $R^4$ is a group represented by Chemical Formula A,

[Chemical Formula A]

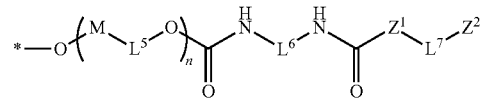

In Chemical Formula A,

M is $C(=O)$, $C(=O)O$, or $OC(=O)$, $L^5$ to $L^7$ are independently a single bond or a substituted or unsubstituted C1 to C10 alkylene group, one of $Z^1$ and $Z^2$ is a cationic functional group, the other of $Z^1$ and $Z^2$ is an anionic functional group, and n is 5 to 30.

The cationic functional group may be one of imidazolium ion, an ammonium salt ion ($NH_4^+$), and benzimidazolium ion and the anionic functional group may be one of $SO_3^-$, $PO_3^{2-}$, and $COO^-$.

Chemical Formula A may be represented by Chemical Formula A-1.

[Chemical Formula A-1]

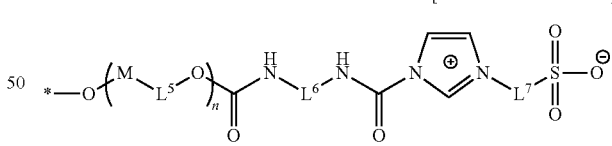

In Chemical Formula A-1,

M is $C(=O)$, $C(=O)O$, or $OC(=O)$, $L^5$ to $L^7$ are independently a single bond or a substituted or unsubstituted C1 to C10 alkylene group, and n is 5 to 30.

The second oligomers may have a quadruple hydrogen-bondable functional group.

The quadruple hydrogen-bondable functional group may be represented by Chemical Formula B.

[Chemical Formula B]

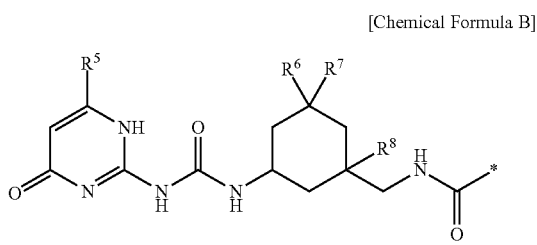

In Chemical Formula B, $R^5$ to $R^8$ are independently hydrogen, a substituted or unsubstituted C1 to C10 alkyl group, or a substituted or unsubstituted C6 to C30 aryl group.

The second oligomers may be represented by Chemical Formula 2.

[Chemical Formula 2]

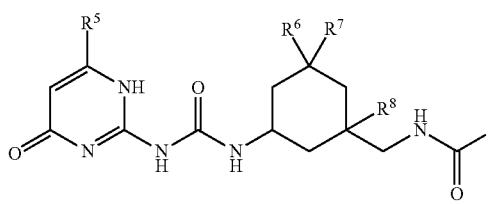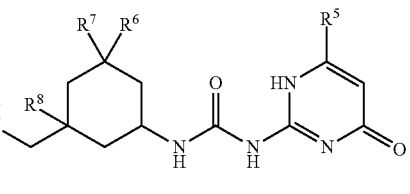

In Chemical Formula 2,

Q is C(=O), C(=O)O, or OC(=O), $L^8$ and $L^9$ are independently a single bond or a substituted or unsubstituted C1 to C10 alkylene group, $R^5$ to $R^8$ are independently hydrogen, a substituted or unsubstituted C1 to C10 alkyl group, or a substituted or unsubstituted C6 to C30 aryl group, and m is 5 to 60.

The first oligomers and the second oligomers may be included in a weight ratio of about 1:9 to about 9:1.

According to another embodiment, a self-healing elastomer including the supramolecular structure is provided.

The self-healing elastomer may satisfy self-healing efficiency of greater than or equal to about 90% at about 40° C. to about 60° C. and a tensile stress of about 0.3 MPa to about 3 MPa simultaneously.

According to another embodiment, a method of manufacturing a supramolecular structure includes preparing a plurality of first oligomers having a zwitterion at the terminal end, preparing a plurality of second oligomers having a hydrogen-bondable functional group at the terminal end, and mixing the plurality of the first oligomers and the plurality of second oligomers to form the supramolecular structure comprising a supramolecule comprising the plurality of the first oligomers and a supramolecule comprising the plurality of the second oligomers.

The preparing of the plurality of the first oligomers may include preparing an oligomer having a quaternary carbon structure, bonding one of a cationic functional group and an anionic functional group with the terminal end the oligomer having the quaternary carbon structure to prepare an ionic bonding derivative, and bonding the other of the cationic functional group and the anionic functional group with the ionic bonding derivative to prepare first oligomers having a zwitterion at the terminal end.

The preparing of the plurality of the second oligomers may include preparing a compound having a quadruple hydrogen-bondable functional group and introducing the quadruple hydrogen-bondable functional group at both terminal ends of the linear oligomer.

The mixing of the first oligomers and the second oligomers may include mixing the first oligomers and the second oligomers in a weight ratio of about 1:9 to about 9:1.

According to another embodiment, a self-healing film including the self-healing elastomer is provided.

According to another embodiment, an electronic device including the self-healing film is provided.

The supramolecular structure may satisfy self-healing characteristics and mechanical characteristics simultaneously.

DETAILED DESCRIPTION

Example embodiments will hereinafter be described in detail, and may be easily performed by a person having an ordinary skill in the related art. However, this disclosure may be embodied in many different forms and is not to be construed as limited to the exemplary embodiments set forth herein.

As used herein, when a definition is not otherwise provided, 'substituted' refers to replacement of hydrogen of a compound by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

As used herein, when a definition is not otherwise provided, 'hetero' refer to inclusion of at least one to four heteroatoms selected from N, O, S, Se, Te, Si, and P.

Hereinafter, a supramolecular structure according to an embodiment is described with reference to drawings.

Figure 1:
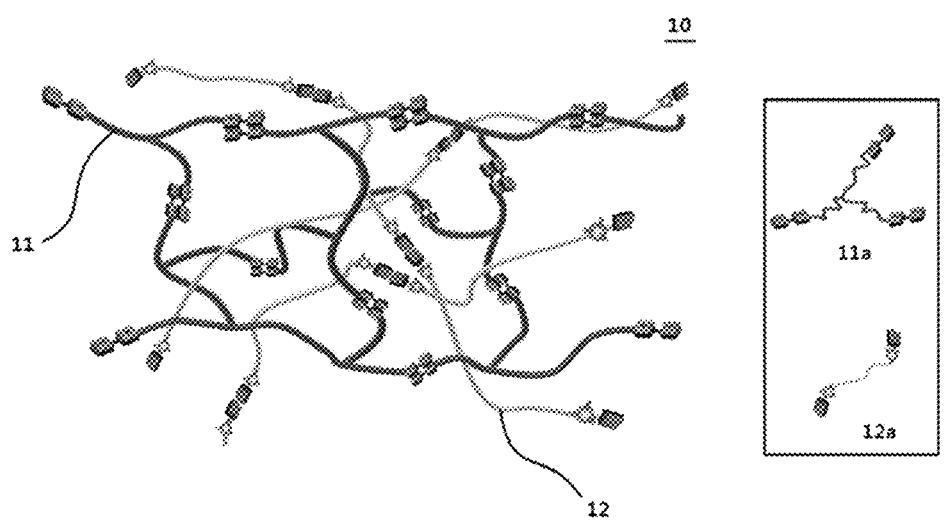
FIG. 1 is a schematic view showing a supramolecular structure according to an embodiment.

FIG. 1 is a schematic view showing a supramolecular structure according to an embodiment.

A supramolecular structure 10 according to an embodiment includes a supramolecule 11 comprising (or consisting of) a plurality of first oligomers 11a and a supramolecule 12 comprising (or consisting of) a plurality of second oligomers 12a, wherein the supramolecule 11 comprising (or consisting of) the plurality of first oligomers 11a and the supramolecule 12 comprising (or consisting of) the plurality of second oligomers 12a form a three-dimensional network structure. The first oligomers 11a may be oligomers having a zwitterion at the terminal end and the second oligomers 12a may be oligomers having a hydrogen-bondable functional group at the terminal end.

The supramolecule 11 comprising (or consisting of) the plurality of first oligomers 11a may form a three-dimensional network by binding zwitterions which are positioned at terminal ends of the plurality of first oligomers 11a.

The first oligomers 11a may be non-linear oligomers, for example oligomers having a quaternary carbon structure. The zwitterion may be bonded at each terminal end of the first oligomers 11a. Zwitterions positioned at terminal ends of the first oligomers 11a may ionic bonded with zwitterions positioned at terminal ends of the adjacent first oligomers 11a. The ionic bond may be strong dynamic bond.

For example, the first oligomer 11a may be a non-linear carbonate oligomer which is bonded with zwitterions at the terminal ends, for example, may be a star-shaped carbonate oligomer which is bonded with zwitterions at terminal ends.

For example, the first oligomer 11a may be a non-linear caprolactone oligomer which is bonded with zwitterions at the terminal ends, for example, may be a star-shaped caprolactone oligomer which is bonded with zwitterions at terminal ends.

For example, the first oligomers 11a may be represented by Chemical Formula 1.

[Chemical Formula 1]

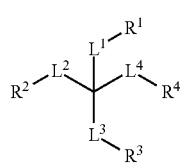

In Chemical Formula 1, $L^1$ to $L^4$ are independently a single bond or a substituted or unsubstituted C1 to C10 alkylene group, and $R^1$ to $R^4$ are independently a substituted or unsubstituted C1 to C10 alkyl group, a substituted or unsubstituted C6 to C30 aryl group, or a group represented by Chemical Formula A, provided that at least one of $R^1$ to $R^4$ is a group represented by Chemical Formula A,

[Chemical Formula A]

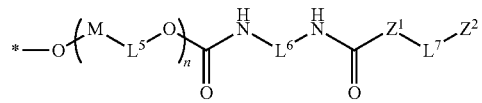

In Chemical Formula A,

M is $C(=O)$, $C(=O)O$, or $OC(=O)$, $L^5$ to $L^7$ are independently a single bond or a substituted or unsubstituted C1 to C10 alkylene group, one of $Z^1$ and $Z^2$ is a cationic functional group, the other of $Z^1$ and $Z^2$ is an anionic functional group, and n is 5 to 30.

For example, at least two of $R^1$ to $R^4$ may be the group represented by the Chemical Formula A.

For example, at least three of $R^1$ to $R^4$ may be the group represented by the Chemical Formula A.

For example, $Z^1$ may be a cationic functional group and $Z^2$ may be an anionic functional group.

For example, the cationic functional group may be one of imidazolium ion, an ammonium salt ion ($NH_4^+$), and benzimidazolium ion and the anionic functional group may be one of $SO_3^-$, $PO_3^{2-}$, and $COO^-$, but they are not limited thereto.

For example, Chemical Formula A may be represented by Chemical Formula A-1.

[Chemical Formula A-1]

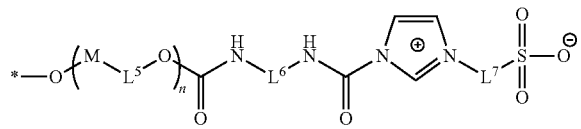

In Chemical Formula A-1,

M, $L^5$ to $L^7$, and n are the same as described above.

For example, a molecular weight of the first oligomers 11a may be about 3,000 g/mol to about 12,000 g/mol.

The supramolecule 12 comprising (or consisting of) the plurality of second oligomers 12a may form a long chain by binding hydrogen-bondable functional groups disposed at terminal ends of the plurality of second oligomers 12a.

The second oligomer 12a may be a linear oligomer. The hydrogen-bondable functional groups are bonded with both terminal ends of the second oligomer 12a. The hydrogen-bondable functional groups positioned at terminal ends of the second oligomers 12a may be form a hydrogen bond with the hydrogen-bondable functional groups positioned at terminal ends of the adjacent second oligomers 12a. The hydrogen bond may be a weak dynamic bond.

The hydrogen-bondable functional group may be for example a group including —OH, —OR', —NH$_2$, —NHR', —NR'$_2$, —C(=O)OH, —C(=O)OR', —C(=O)NH$_2$, —NHOH, —NR'OR', —NHC(=O)—, —NHC(=O)

—NH—, —NR'C(=O)—, —NH—, —NR'—, —C(=O)O, —C(=O)NHC(=O)—, —C(=O)NR'C(=O)—, —NHNH—, —NR'NH—, —NR'NR'— (wherein R' is the same or different and is a C1 to C20 aliphatic hydrocarbon or a C6 to C30 aromatic hydrocarbon) alone or in a combination of two or more.

For example, the second oligomers 12a may be a linear carbonate oligomer which is bonded with hydrogen-bondable functional groups at both terminal ends.

For example, the second oligomers 12a may be a linear caprolactone oligomer which is bonded with hydrogen-bondable functional groups at both terminal ends thereof.

For example, the hydrogen-bondable functional group may be a quadruple hydrogen-bondable functional group.

For example, the quadruple hydrogen-bondable functional group may be represented by Chemical Formula B.

[Chemical Formula B]

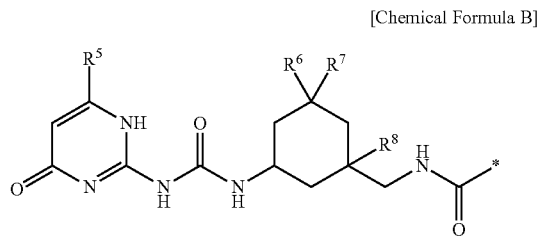

In Chemical Formula B, $R^5$ to $R^8$ are independently hydrogen, a substituted or unsubstituted C1 to C10 alkyl group, or a substituted or unsubstituted C6 to C30 aryl group.

For example, the second oligomers 12a may be represented by Chemical Formula 2.

[Chemical Formula 2]

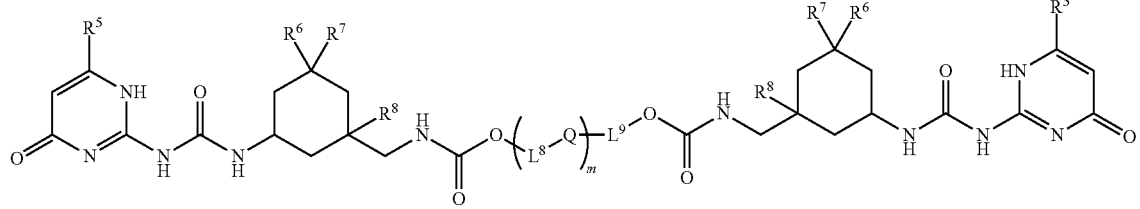

In Chemical Formula 2,

Q is C(=O), C(=O)O, or OC(=O), $L^8$ and $L^9$ are independently a single bond or a substituted or unsubstituted C1 to C10 alkylene group, $R^5$ to $R^8$ are independently hydrogen, a substituted or unsubstituted C1 to C10 alkyl group, or a substituted or unsubstituted C6 to C30 aryl group, and m is 5 to 60.

For example, a molecular weight of the second oligomers 12a may be about 1,000 g/mol to about 9,000 g/mol.

As described above, the supramolecule 11 comprising (or consisting of) the plurality of first oligomers 11a may form a three-dimensional network by ionic bonding zwitterions positioned at terminal ends of the adjacent first oligomers 11a with each other, and the supramolecule 12 comprising (or consisting of) the plurality of second oligomers 12a may form a long chain by hydrogen-bonding with the hydrogen-bondable functional groups positioned at the terminal ends of the adjacent second oligomers 12a to each other. For example, the supramolecular structure 10 may be a structure that the linear supramolecules 12 comprising (or consisting of) the plurality of second oligomers 12a are penetrated through the three-dimensional network structures of the supramolecules 11 comprising (or consisting of) the plurality of first oligomers 11a.

As described above, the supramolecular structure 10 may have a double dynamic bonding structure including a strong ionic bond and a weak hydrogen bond. Thus the supramolecular structure 10 may maintain and/or improve morphology and mechanical properties of the superamolecular structure 10 with the supramolecule 11 formed by means of the strong ionic bond and may carry out the self-healing properties by the supramolecule 12 formed by means of the weak hydrogen bond, so that the supramolecular structure 10 may simultaneously satisfy the self-healing property and the mechanical strength which have trade-off relationships.

Thereby, the supramolecular structure 10 may be effectively employed as a self-healing elastomer.

The supramolecular structure 10 may adjust the self-healing property and the mechanical strength according to a ratio of the supramolecule 11 comprising (or consisting of) the plurality of first oligomers 11a and the supramolecule 12 comprising (or consisting of) the plurality of second oligomers 12a. For example, the first oligomers 11a and the second oligomers 12a may be included in a weight ratio of about 1:9 to about 9:1. Within the range, the first oligomers 11a and the second oligomers 12a may be included in a weight ratio of about 2:8 to about 8:2 or about 3:7 to about 7:3. For example, the first oligomers 11a and the second oligomers 12a may be included in a weight ratio of about 5:5 to about 1:9. Within the range, the first oligomers 11a and the second oligomers 12a may be included in a weight ratio of about 5:5 to about 2:8 or about 5:5 to about 3:7.

When the supramolecular structure 10 is applied as a self-healing elastomer, the self-healing elastomer may satisfy self-healing efficiency of greater than or equal to about 90% at about 40° C. to about 60° C. and a tensile stress of about 0.3 MPa to about 3 MPa simultaneously. Within the ranges, the self-healing elastomer may satisfy self-healing efficiency of greater than or equal to about 91% and a tensile stress of about 0.4 MPa to about 2.5 MPa.

Hereinafter, a method of manufacturing the supramolecular structure 10 is exemplarily described.

A method of manufacturing the supramolecular structure 10 according to an embodiment includes preparing a plurality of first oligomers 11a having a zwitterion at the terminal end, preparing a plurality of second oligomers 12a having a hydrogen-bondable functional group at the terminal end, and mixing the plurality of the first oligomers 11a and the plurality of second oligomers 12a to form the supramolecular structure 10 comprising a supramolecule 11 comprising (or consisting of) the plurality of first oligomers 11a and a supramolecule 12 comprising (or consisting of) the plurality of second oligomers 12a.

The preparing of the plurality of the first oligomers 11a may include for example preparing an oligomer having a quaternary carbon structure, bonding one of a cationic functional group and an anionic functional group with the terminal end of the oligomer having the quaternary carbon structure to prepare an ionic bonding derivative, and bonding the other of the cationic functional group and the anionic functional group with the ionic bonding derivative to prepare first oligomers having a zwitterion at the terminal end.

The oligomer having the quaternary carbon structure may be obtained, for example, by a ring-opening reaction of a cyclic carbonate monomer and/or a caprolactone monomer and a quaternary carbon structure compound. For example, the oligomer having the quaternary carbon structure may be obtained by a ring-opening reaction of a cyclic carbonate monomer and/or a caprolactone monomer and an aliphatic compound having a hydroxy group, wherein the aliphatic compound having a hydroxy group may be, for example, trimethylolpropane, but is not limited thereto. The oligomer having the quaternary carbon structure may be, for example, a star-shaped carbonate oligomer and/or a star-shaped caprolactone oligomer.

Then, the ionic bonding derivative may be obtained by reacting one of a cationic compound and an anionic compound with an oligomer having a quaternary carbon structure. The cationic compound may be a compound capable of providing a cationic functional group, and the anionic compound may be a compound capable of providing an anionic functional group. The cationic compound may be for example a compound including imidazolium ion, an ammonium salt ion ($NH_4^+$), or benzimidazolium ion, and the anionic compound may be for example a compound including $SO_3^-$, $PO_3^{2-}$, or $COO^-$, but are not limited thereto.

For example, an imidazole isocyanate obtained by reacting imidazole and diisocyanate may be used as the cationic compound, and the ionic bonding derivative may be, for example, a reaction product of a star-shaped carbonate oligomer and/or a star-shaped caprolactone oligomer and an imidazole isocyanate.

Next, the other one of the cationic compound and the anionic compound is reacted with the ionic bonding derivative to provide a first oligomer having zwitterions, which have both the cationic functional group and the anionic functional group, at the terminal ends.

The preparing of the second oligomers 12a may include preparing a compound having a quadruple hydrogen-bondable functional group and introducing the quadruple hydrogen-bondable functional group at both terminal ends of the linear oligomer.

The compound having the quadruple hydrogen-bondable functional group may be for example obtained from aliphatic cyclic diisocyanate, and may be for example a reaction product of 2-amino-4-hydroxy-6-methylpyrimidine and isophorone diisocyanate.

For example, the second oligomer may be a final product obtained from the reaction products of 2-amino-4-hydroxy-6-methylpyrimidine and isophorone diisocyanate with the linear carbonate oligomer and/or the linear caprolactone oligomer.

The first oligomers 11a and the second oligomers 12a may be mixed in various ratios. For example, The first oligomers 11a and the second oligomers 12a may be mixed in a weight ratio of about 9:1 to about 1:9, or within the range, in a weight ratio of about 8:2 to about 2:8, about 7:3 to about 3:7, or about 6:4 to about 4:6, or about 5:5. For example, the first oligomers 11a and the second oligomers 12a may be included in a weight ratio of about 5:5 to about 1:9, within the range, the first oligomers 11a and the second oligomers 12a may be included in a weight ratio of about 5:5 to about 2:8, within the range, in a weight ratio of about 5:5 to about 3:7.

The first oligomers 11a and the second oligomers 12a may be mixed in a solvent. The solvent may be an organic solvent, and may include for example chloroform, hexane, ketone, benzene, toluene, xylene, octane, nonane, cyclohexane, acetone, or a combination thereof, but is not limited thereto.

The supramolecular structure 10 may be obtained by, for example, a solution casting, but is not limited thereto.

The supramolecular structure 10 may be employed as a self-healing elastomer due to high self-healing efficiency and mechanical strength as mentioned above, but may be formed in a film to provide a self-healing film.

The self-healing film may be a transparent film having a thickness of, for example, about 0.1 mm to about 1 mm. The self-healing film may be, for example, a flexible transparent film.

The supramolecular structure 10, the self-healing elastomer, or the self-healing film may be employed in the various fields such as an electronic device, an aerospace material, a constructing material, and a medical material depending upon the usage. The electronic device may be usefully applied for, for example, a smart phone, tablet PC, a camera, a touch screen panel and the like mounting a display panel, but is not limited thereto.

For example, the self-healing film may be effectively applied as a window film in a display device, for example a flexible display device. The self-healing film may be attached on the display panel. The display panel and the self-healing film may be directly bonded or may be bonded by interposing an adhesive. The display panel may be for example a liquid crystal display panel or an organic light emitting display panel, but is not limited thereto. The self-healing film may be disposed at the side of an observer.

Figure 13:
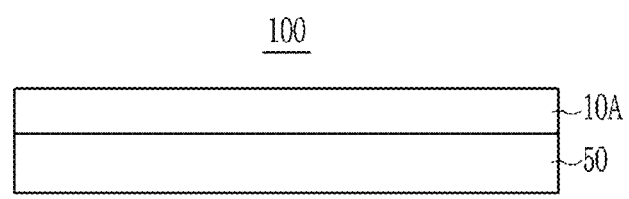
FIG. 13 is a cross-sectional view of a display device according to an embodiment.

FIG. 13 is a cross-sectional view of a display device according to an embodiment.

Referring to FIG. 13, a display device 100 according to an embodiment includes a display panel 50 and a self-healing film 10A.

The display panel 50 may be for example an organic light emitting display panel or a liquid crystal display panel, for example a bendable display panel, a foldable display panel, or a rollable display panel.

The self-healing film 10A may include the supramolecular structure 10 and may be disposed at the side of an observer. Another layer may be further interposed between the display panel 50 and the self-healing film 10A and may include for example a monolayer or plural layers of polymer layer (not shown) and optionally a transparent adhesive layer (not shown).

Figure 14:
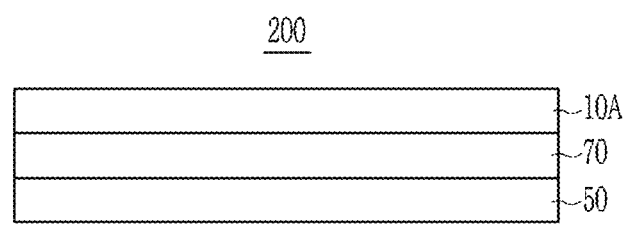
FIG. 14 is a cross-sectional view of a display device according to another embodiment.

FIG. 14 is a cross-sectional view of a display device according to another embodiment.

Referring to FIG. 14, a display device 200 according to the present embodiment includes a display panel 50, a self-healing film 10A, and a touch screen panel 70 between the display panel 50 and the self-healing film 10A.

The display panel 50 may be for example an organic light emitting display panel or a liquid crystal display panel, for example a bendable display panel, a foldable display panel, or a rollable display panel.

The self-healing film 10A may include the supramolecular structure 10 and may be disposed at the side of an observer.

The touch screen panel 70 may be disposed adjacent to each of the window film 10A and the display panel 50, and when is touched by a human hand or an object through the self-healing film 10A, may recognize the touched position and the position change and then to output a touch signal. The driving module (not shown) may monitor a position where is touched from the output touch signal; recognize an icon marked at the touched position; and control to carry out functions corresponding to the recognized icon, and the function performance results are displayed on the display panel 50.

Another layer may be further interposed between the touch screen panel 70 and the self-healing film 10A and may include for example a monolayer or plural layers of polymer layer (not shown) and optionally a transparent adhesive layer (not shown).

Another layer may be further interposed between the touch screen panel 70 and the display panel 50 and may include for example a monolayer or plural layers of polymer layer (not shown) and optionally a transparent adhesive layer (not shown).

Hereinafter, the embodiments are illustrated in more detail with reference to examples. However, these examples are exemplary, and the present disclosure is not limited thereto.

Preparation of First Oligomers

Synthesis Example 1

Step 1: Synthesis of Oligomer (SPC)

[Reaction Scheme 1]

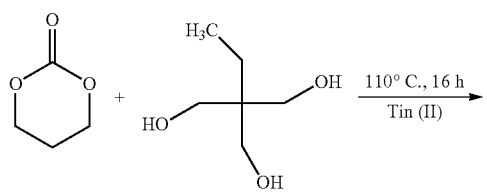

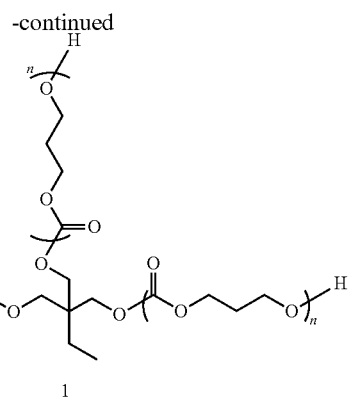

10 g of 1,3-propanediol and 28.4 g of ethyl chlorofomate are added into THF in a 3-neck flask and placed in an ice-bath, and then 26.5 g of triethylamine and 260 mL of THF are mixed and slowly dropped thereto using a dripping funnel with stirring for 1 hour. After completing the dropping, it is further stirred at room temperature for 2 hours, and the generated salt is removed. Subsequently, it is recrystallized using diethyl ether and THF to provide a white solid, and then the white solid is filtered and dried using a vacuum oven at room temperature for 24 hours to provide trimethylene carbonate.

Subsequently, 17.5 g of the obtained trimethylene carbonate and 0.3 g of 1,1,1-tri(hydroxyl-methyl)propane (TMP) are input into a 3-neck flask, and the vacuum/nitrogen process is repeated for 3 times to remove moisture. Subsequently, a Tin(II) catalyst is added thereto under a nitrogen atmosphere and then stirred at 110° C. for 16 hours to provide Compound 1 of a star-shaped carbonate oligomer (MW=8,090 g/mol). A yield is 100%.

Figure 2:
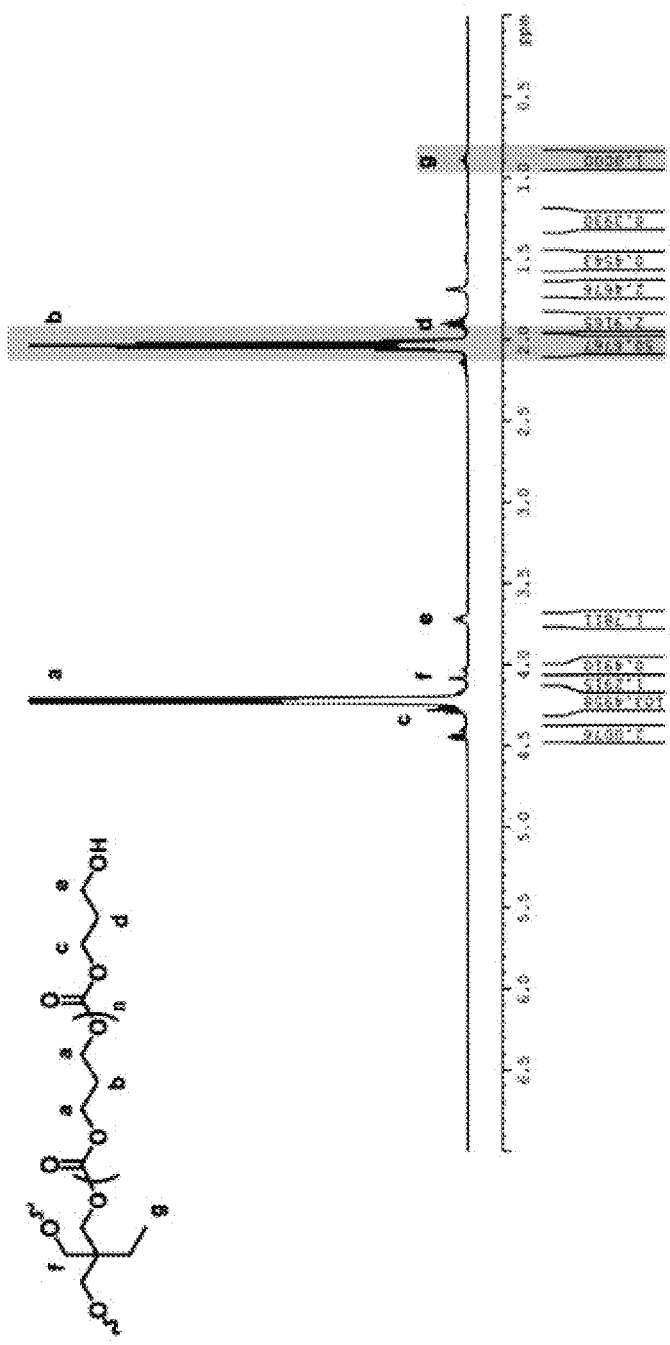
FIG. 2 shows NMR data of Compound 1 obtained in Synthesis Example 1.

$^1$H NMR results of Compound 1 are shown in FIG. 2.

Step 2: Synthesis of Ionic Bonding Derivative

[Reaction Scheme 2]

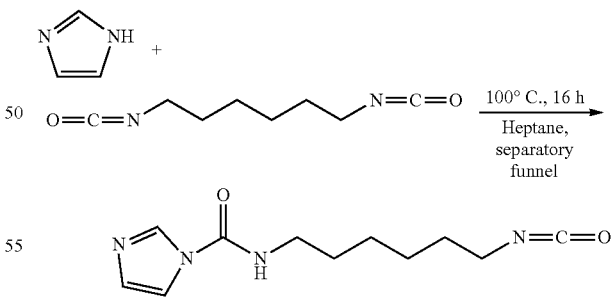

8 g of imidazole and 150 mL of hexamethylene diisocyanate (HDI) are added into 2-neck flask and reacted by stirring at 100° C. for 16 hours, and then the remaining HDI is removed using a separatory funnel by heptanes which is repeated for 4 times. Subsequently, the remaining heptane is removed using a rotary evaporator to provide Compound 3 (imidazole functionalized isocyanate, IM-NCO).

[Reaction Scheme 3]

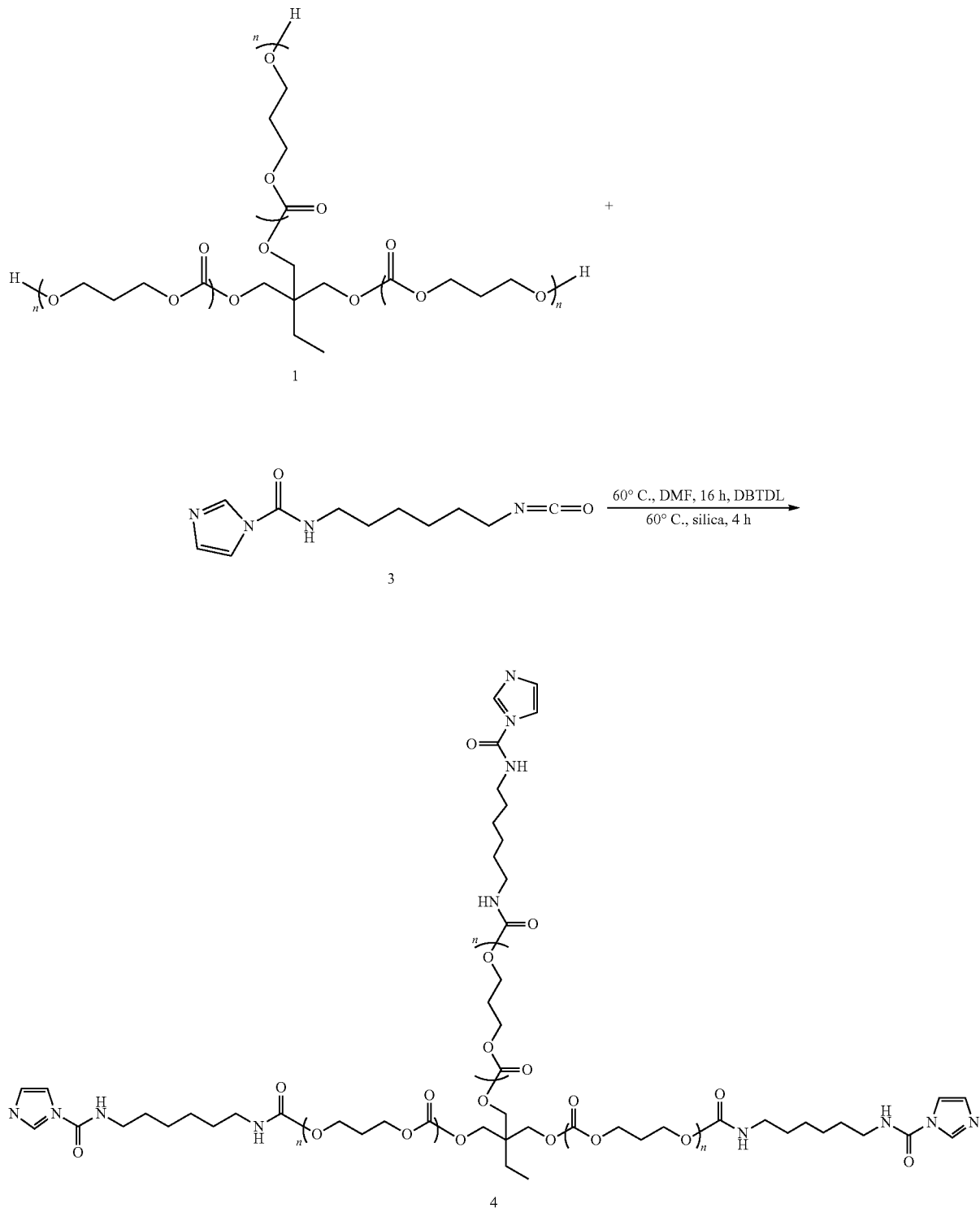

9 g of Compound 1 (MW=8,090 g/mol) and 1.2 g of Compound 3 (IM-NCO) (in a ratio of 4.5 mol per 1 mol of Compound 1) are dissolved in 150 mL of DMF and then reacted under a dibutyl tin dilaurate (DBTDL) catalyst with stirring at 60° C. for 16 hours under a nitrogen atmosphere. Subsequently, it is stirred using silica at 60° C. for 4 hours to remove the non-reacted imidazole-substituted isocyanate (IM-NCO). After completing the reaction, the remaining silica is removed by a filtering process to provide Compound 4 (IM functionalized SPC, IM-SPC).

Figure 3:
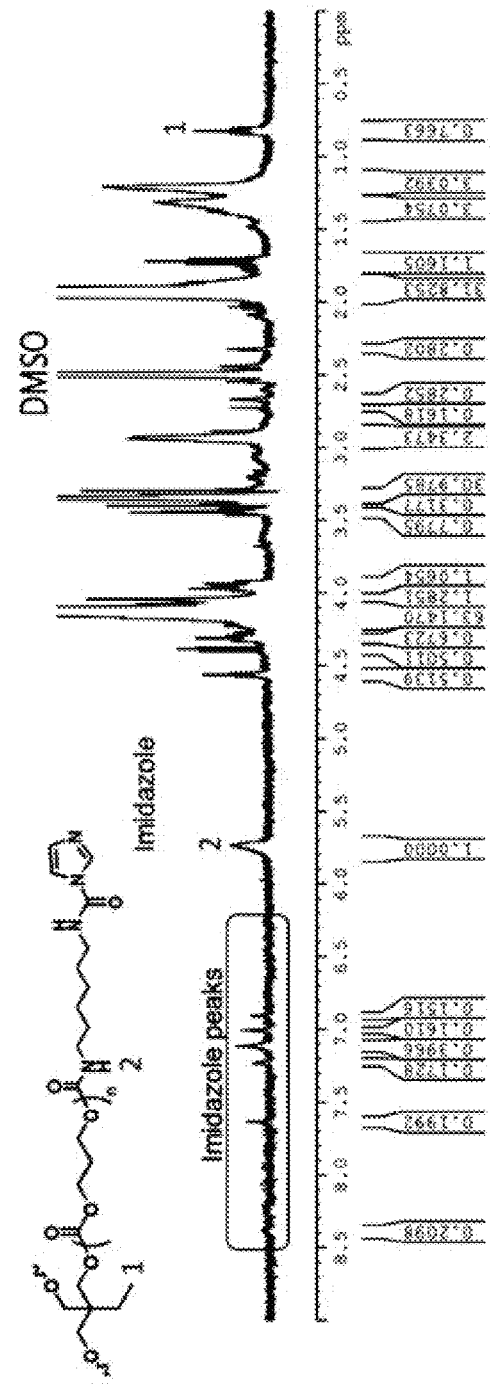
FIG. 3 shows NMR data of Compound 4 obtained in Synthesis Example 1.

$^1$H NMR results of Compound 4 are shown in FIG. 3.

Step 3: Synthesis of Zwitterion Oligomer

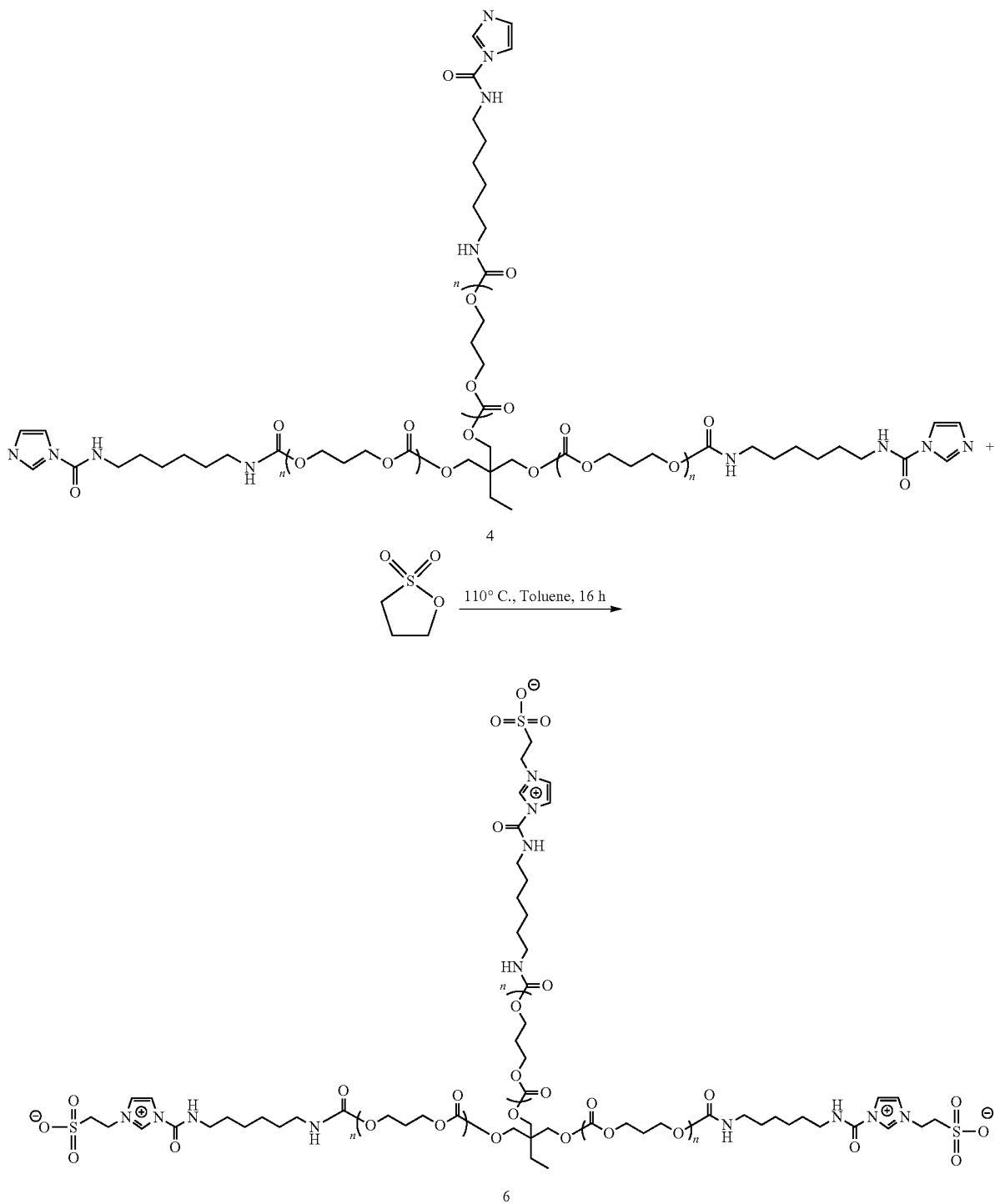

0.59 mL of 1,3-propanesultone is added into Compound 4 dissolved in toluene and stirred at 110° C. for 16 hours under a nitrogen atmosphere. After the reaction, the toluene is removed using a rotary evaporator, the condensed filtrate is immersed in methanol to provide a yellowish solid, and the yellowish solid is filtered. Subsequently, the filtered yellowish solid is dried at room temperature for 24 hours using a vacuum oven to finally provide Compound 6 (Zwitterion functionalized SPC, ZWSPC).

Figure 4:
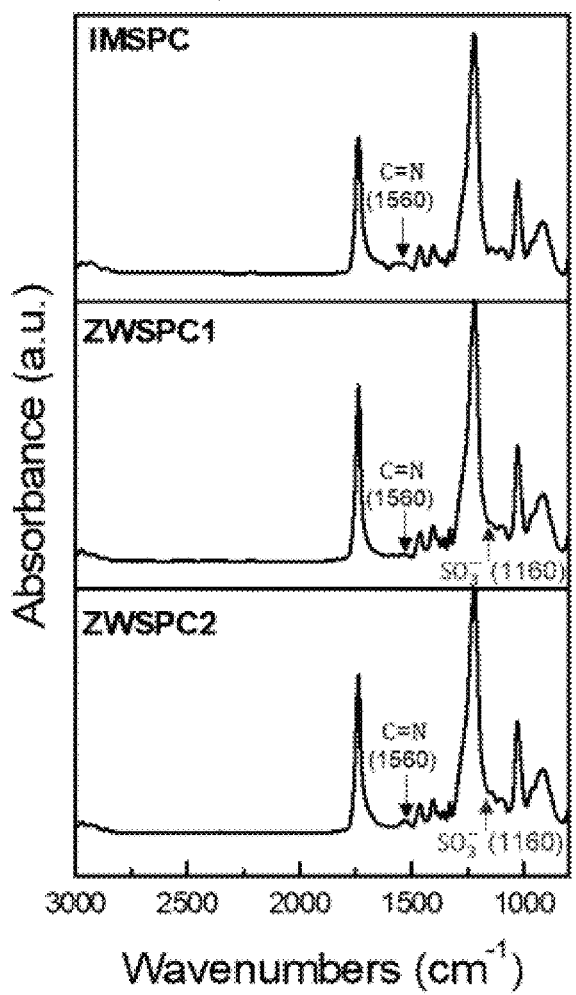
FIG. 4 shows FT-IR spectra of Compound 6 obtained in Synthesis Example 1.

FT-IR spectra results of Compound 6 are shown in FIG. 4.

Synthesis Example 2

Step 1: Synthesis of Oligomer (SPCL)

[Reaction Scheme 5]

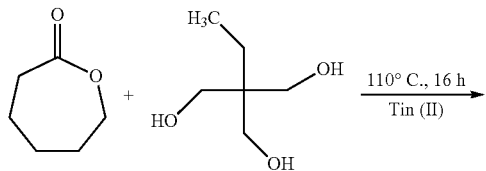

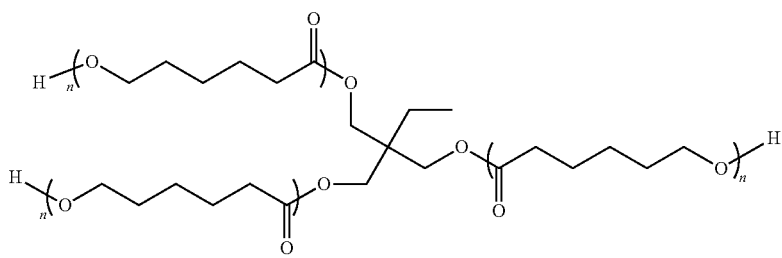

2

20 g of ε-caprolactone and 0.8 g of 1,1,1-tri(hydroxylmethyl)propane (TMP) are added into 3-neck flask, and the vacuum/nitrogen process is repeated for 3 times to remove moisture. Subsequently, after adding a tin(II) catalyst under the nitrogen atmosphere, it is stirred at 110° C. for 16 hours to provide Compound 2 of a star-shaped caprolactone oligomer (MW=3,196 g/mol). A yield is 100%.

Figure 5:
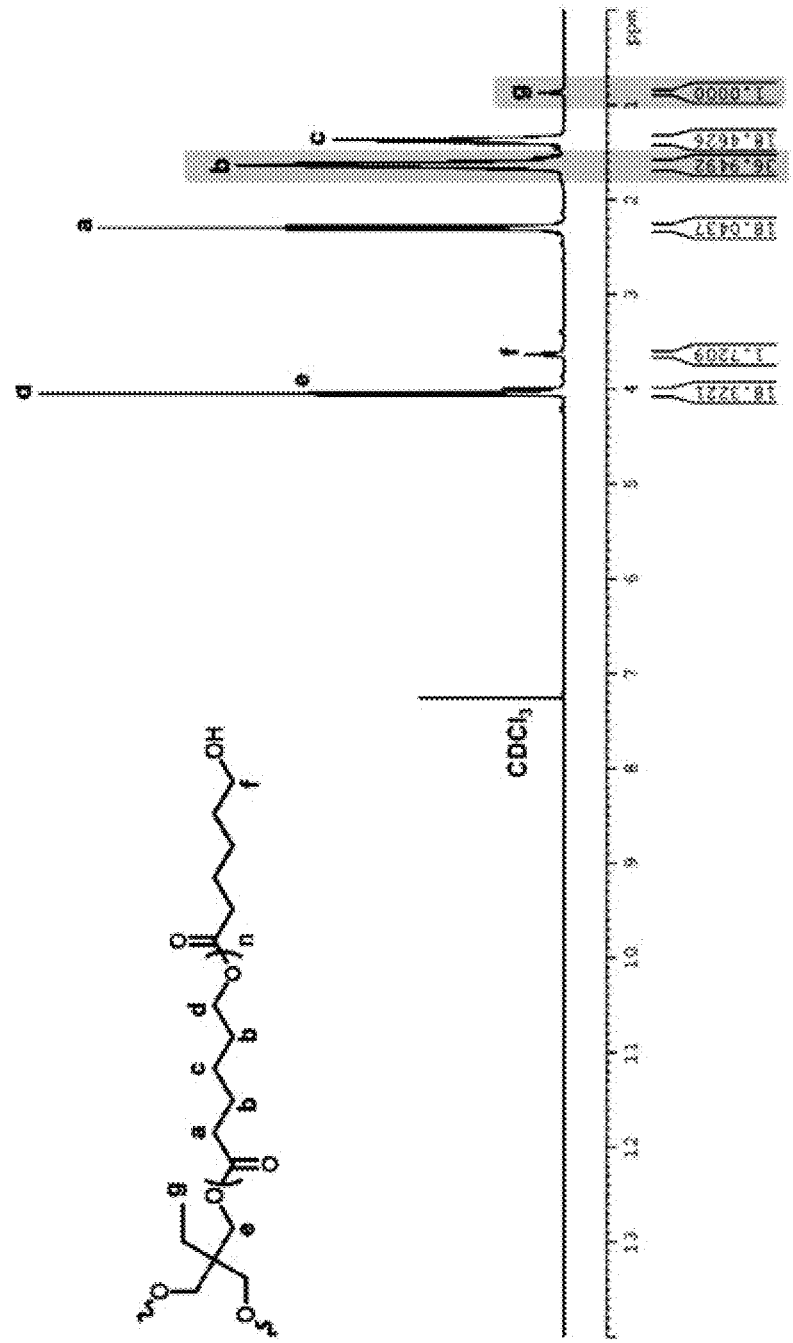
FIG. 5 shows NMR data of Compound 2 obtained in Synthesis Example 2.

$^1$H NMR results of Compound 2 are shown in FIG. 5.

Step 2: Synthesis of Ionic Bonding Derivative

[Reaction Scheme 6]

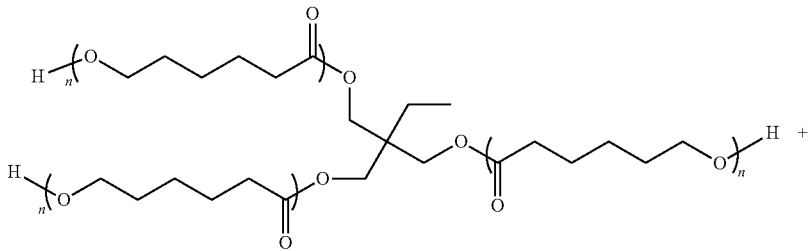

2

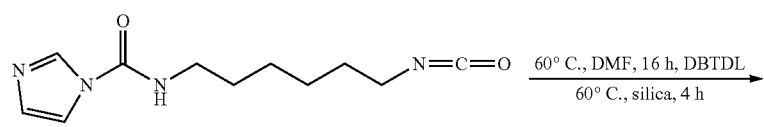

3

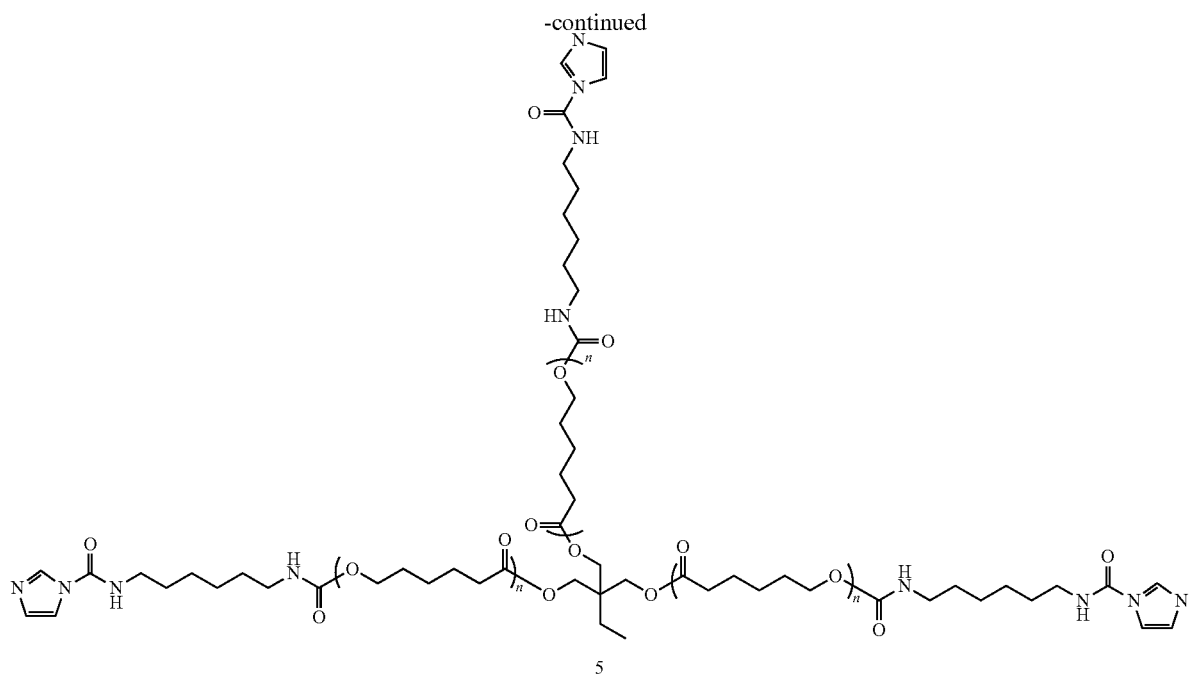

5

8 g of Compound 2 (MW=3,196 g/mol) and 2.55 g of Compound 3 (IM-NCO) (ratio of 4.5 mol per 1 mol of Compound 2) are dissolved in 150 mL of DMF, and then it is stirred at 60° C. for 16 hours under a nitrogen atmosphere to carry out a reaction under a dibutyl tin dilaurate (DBTDL) catalyst. Subsequently, the non-reacted imidazole-substituted isocyanate (IM-NCO) is removed using silica by stirring at 60° C. for 4 hours. After completing the reaction, the remaining silica is removed by the filtering process to provide Compound 5 (IM functionalized SPCL, IM-SPCL).

Figure 6:
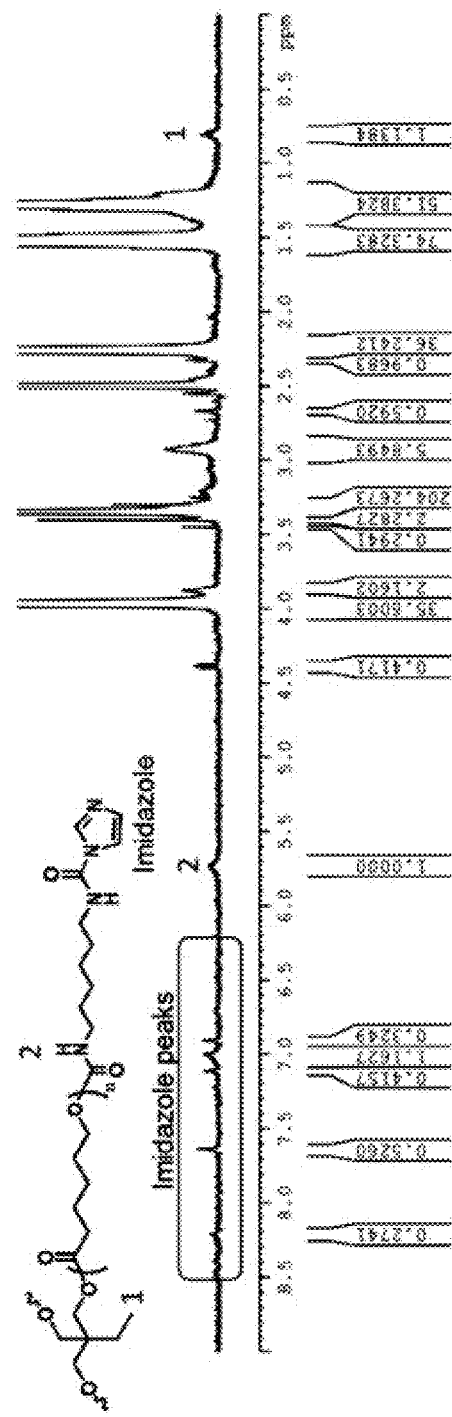
FIG. 6 shows NMR data of Compound 5 obtained in Synthesis Example 2.

1H NMR results of Compound 5 are shown in FIG. 6.

Step 3: Synthesis of Zwitterion Oligomer

[Reaction Scheme 7]

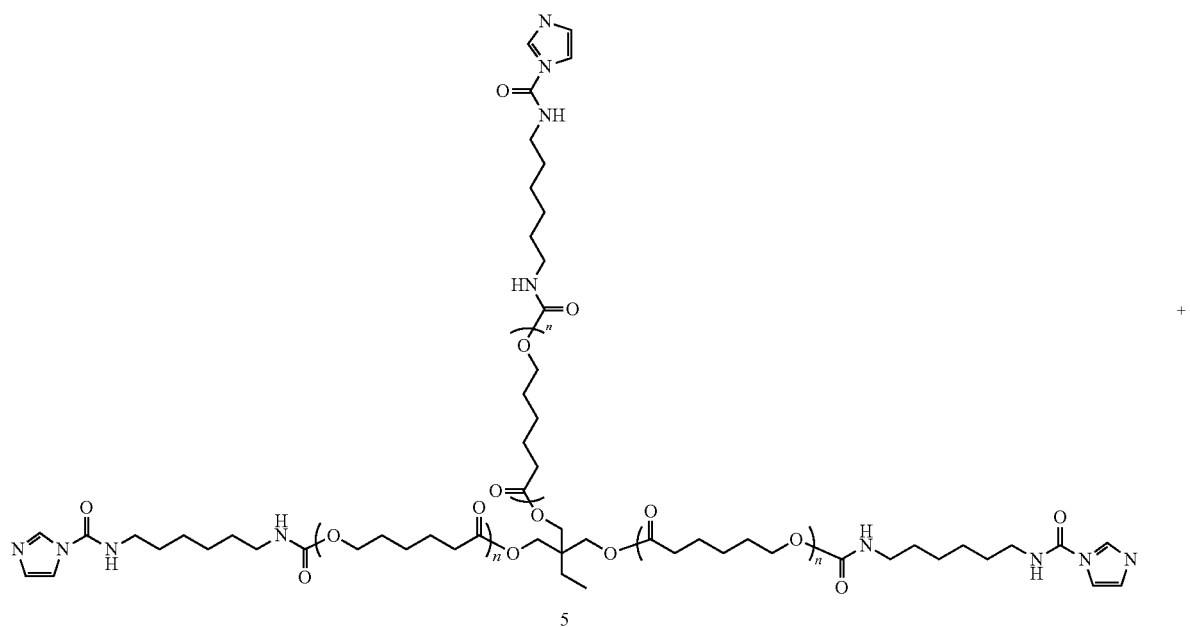

5

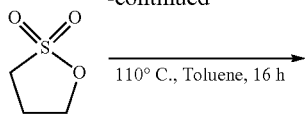

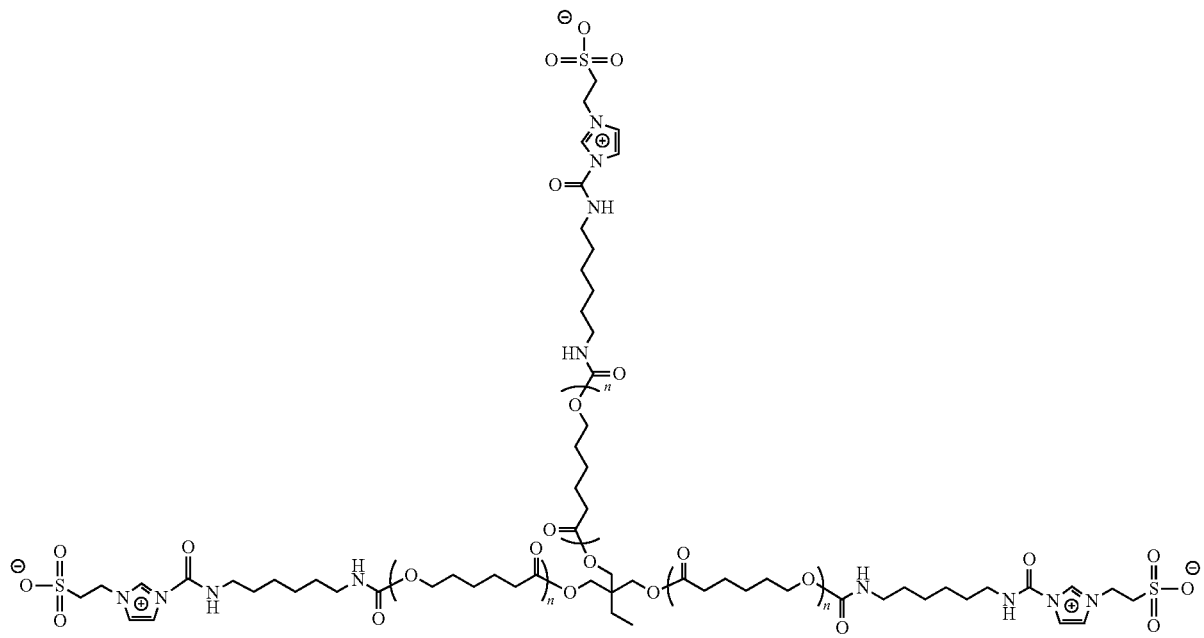

After adding 1.3 mL of 1.3-propanesultone into Compound 5 dissolved in toluene, it is stirred at 110° C. for 16 hours under a nitrogen atmosphere. After completing the reaction, it is condensed by removing the toluene using a rotary evaporator and precipitated in methanol to provide a yellowish solid, and then the yellowish solid is filtered. Subsequently, the filtered yellowish solid is dried at room temperature for 24 hours using a vacuum oven to finally provide Compound 7 (Zwitterion functionalized SPCL, ZWSPCL).

Figure 7:
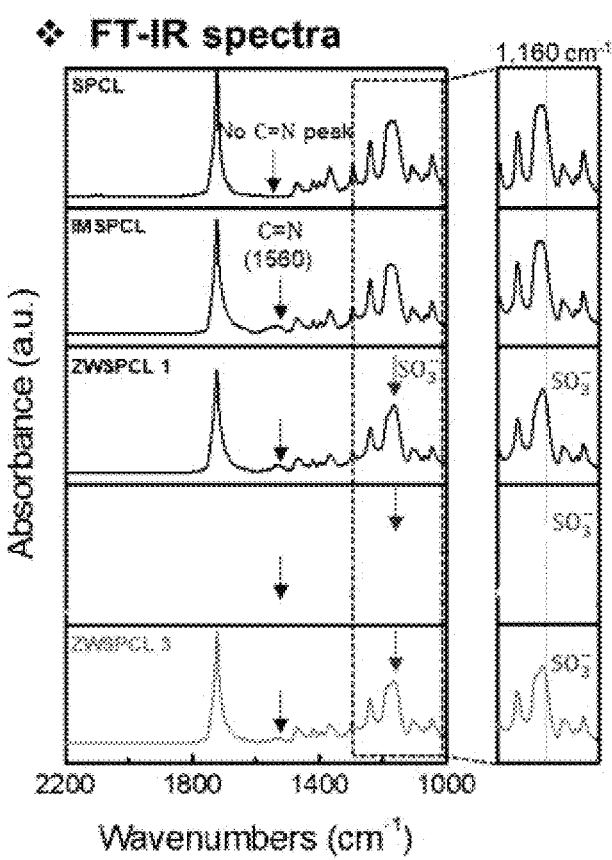
FIG. 7 shows FT-IR spectra of Compound 7 obtained in Synthesis Example 2.

FT-IR spectra results of Compound 7 are shown in FIG. 7.

Preparation of Second Oligomers

Synthesis Example 3

Step 1:

[Reaction Scheme 8]

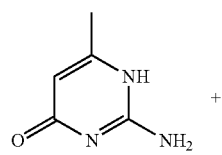
+
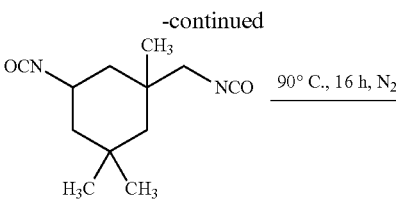
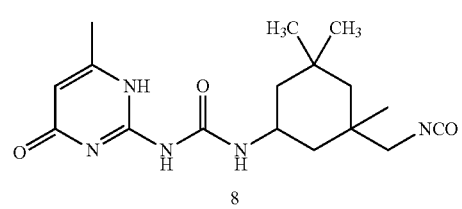

5 g of 2-amino-4-hydroxy-6-methylpyrimidine (CAS No. 3977-29-5) and 88.82 g of isophorone diisocyanate are stirred at 90° C. for 16 hours under a nitrogen atmosphere. The reactants are immersed in heptane and washed for several times, and then filtered to provide a white powder, and the white powder is vacuum-dried at 60° C. for 24 hours to provide Compound 8. A yield is greater than or equal to 50%.

Figure 8:
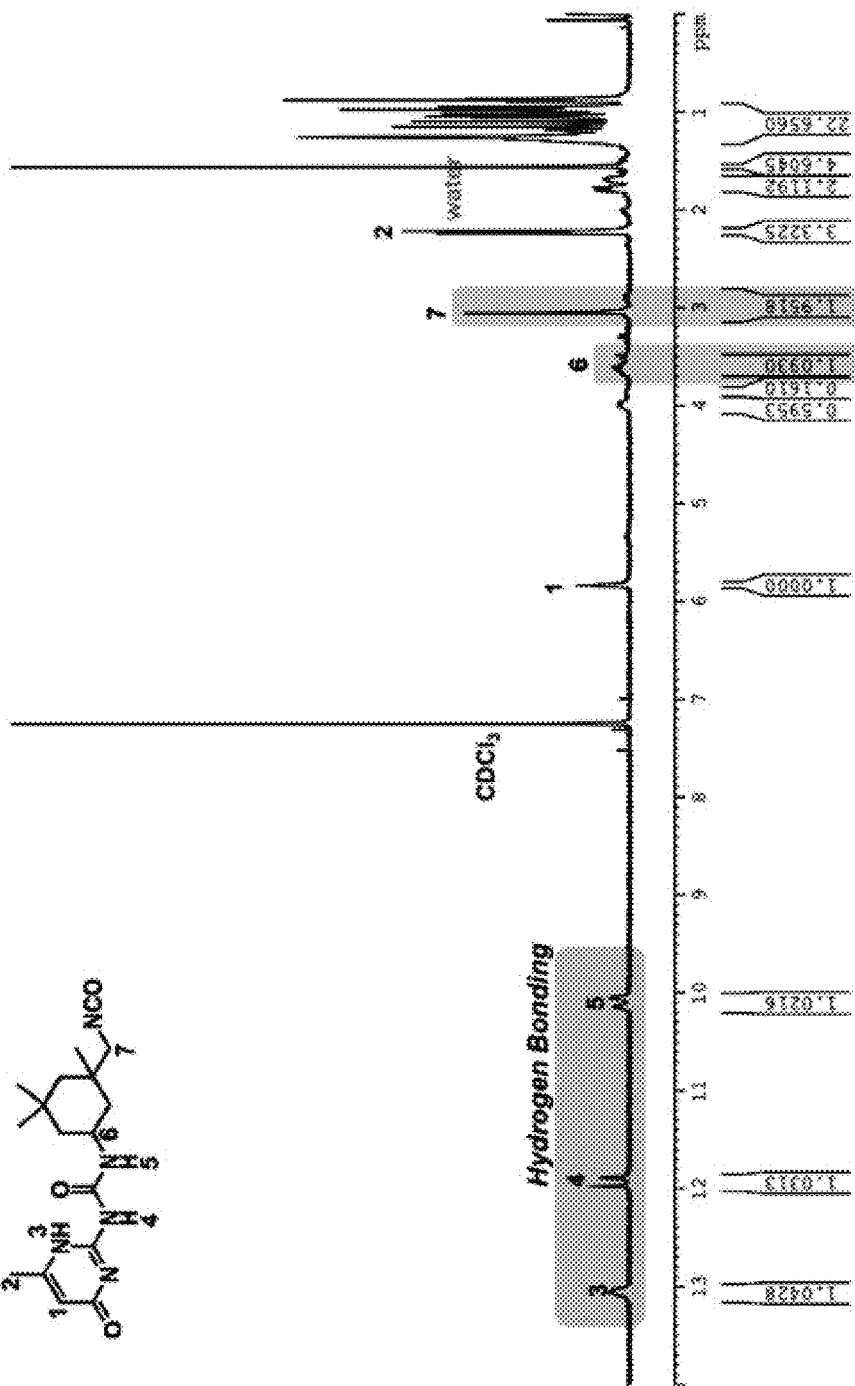
FIG. 8 shows NMR data of Compound 8 obtained in Synthesis Example 3.

$^1$H NMR results of Compound 8 are shown in FIG. 8.

Step 2:

[Reaction Scheme 9]

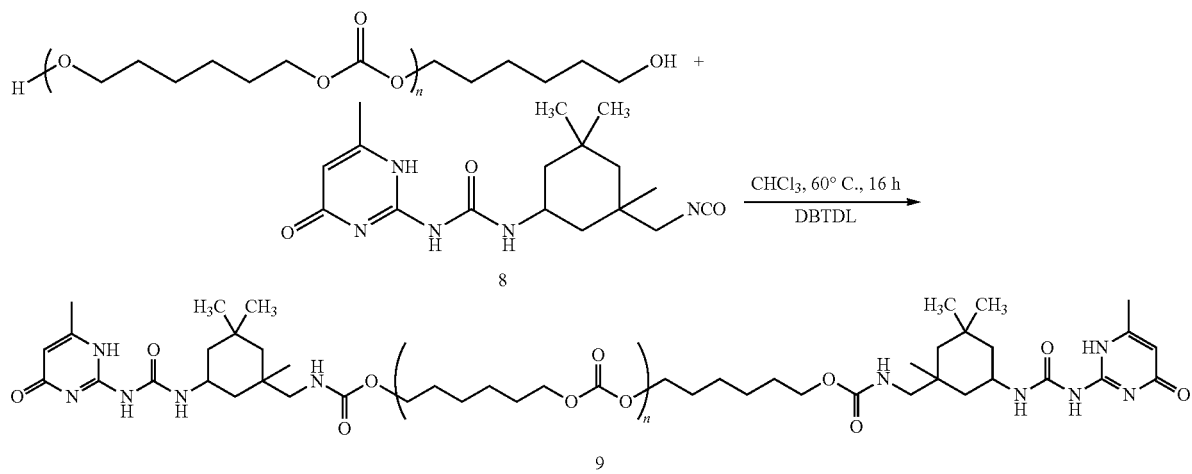

10 g of a carbonate oligomer (Ube industry, MW: 3000 g/mol) is dissolved in chloroform and added with 3.47 g of Compound 8 (3 mol per 1 mol of the carbonate oligomer). 2 drops of dibutyltin dilaurate (DBTDL) catalyst are added thereto and stirred at 60° C. for 16 hours under a nitrogen atmosphere, and then silica gel is added and further stirred at 60° C. for 4 hours to remove the non-reactants. Subsequently, after filtering silica gel from the reactant, the filterate is concentrated and added into heptane to provide a precipitate. After filtering the precipitate, it is vacuum-dried at room temperature for 24 hours to provide Compound 9. A yield is 80%.

Figure 9:
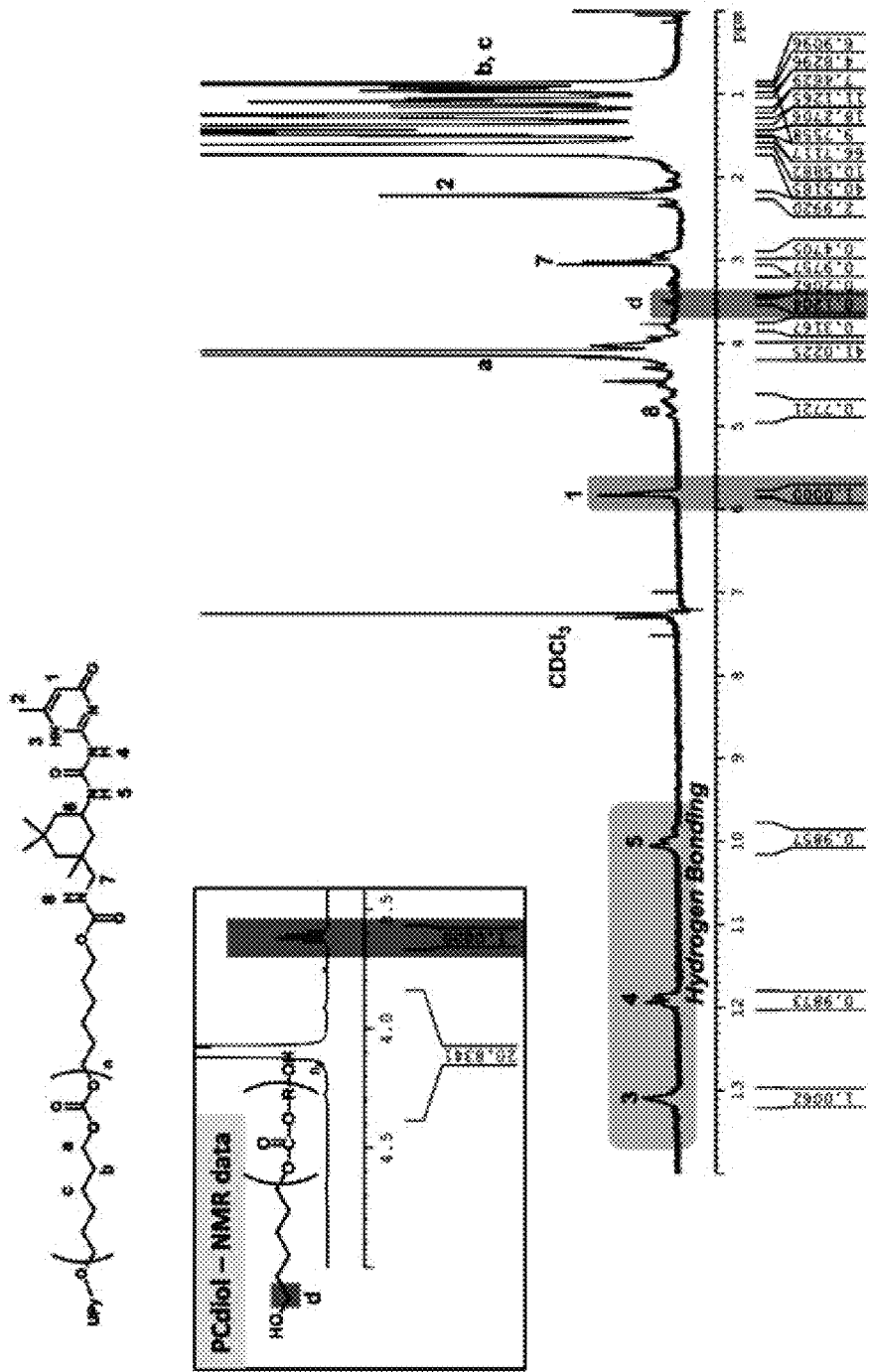
FIG. 9 shows NMR data of Compound 9 obtained in Synthesis Example 3.

$^1$H NMR results of Compound 9 are shown in FIG. 9.

Manufacture of Supramolecular Structure

Preparation Example 1

Compound 6 obtained from Synthesis Example 1 and Compound 9 obtained from Synthesis Example 3 are blended in chloroform in a weight ratio of 5:5 to prepare a solution, and the solution is dried at room temperature for 24 hours to provide a film. The obtained film is heated and compressed using a hot press to provide a supramolecular structure as a film having a thickness of 0.6 mm.

Preparation Example 2

A supramolecular structure is prepared in accordance with the same procedure as in Preparation Example 1, except that Compound 6 obtained from Synthesis Example 1 and Compound 9 obtained from Synthesis Example 3 are included in a weight ratio of 3:7.

Preparation Example 3

Compound 7 obtained from Synthesis Example 2 and Compound 9 obtained from Synthesis Example 3 are blended in chloroform in a weight ratio of 5:5 to provide a solution, and the solution is dried at room temperature for 24 hours to provide a film. The obtained film is heated and compressed using a hot press to provide a supramolecular structure film as a film having a thickness of 0.6 mm.

Preparation Example 4

A supramolecular structure is prepared in accordance with the same procedure as in Preparation Example 3, except that Compound 7 obtained from Synthesis Example 2 and Compound 9 obtained from Synthesis Example 3 are included in a weight ratio of 3:7.

Comparative Preparation Example 1

A supramolecular structure is prepared in accordance with the same procedure as in Preparation Example 1, except that only Compound 9 obtained from Synthesis Example 3 is included, instead of Compound 6 obtained from Synthesis Example 1 and Compound 9 obtained from Synthesis Example 3.

Evaluation

Evaluation I

Supramolecular structures according to Preparation Examples and Comparative Preparation Example are evaluated for mechanical properties.

The mechanical properties are measured using a Universal Testing Machine (UTM), and the measurement sample is fabricated using a film having a thickness of 0.6 mm according to ASTM D 638-V. Using 10 kgf of load cell, a specimen having a width of 3.18 mm is performed with a tensile test at a speed of 10 mm/min. A measuring apparatus is DR-100 manufactured by Drtech (Korea).

The results are shown in Table 1.

TABLE 1

| | Maximum tensile strength (MPa) | Elastic modulus (MPa) |
|---|---|---|
| Preparation Example 1 | 0.56 | 219.06 |
| Preparation Example 2 | 0.34 | 217.88 |
| Preparation Example 3 | 2.62 | 254.17 |
| Preparation Example 4 | 0.86 | 205.78 |
| Comparative Preparation Example 1 | 0.24 | 196.52 |

* elastic modulus: Young's modulus

Referring to Table 1, it is confirmed that the supramolecular structures according to Preparation Examples have superior mechanical characteristics to the supramolecular structure according to Comparative Preparation Example.

Evaluation II

The supramolecular structures according to Preparation Examples are evaluated for mechanical self-healing characteristics.

For evaluating the mechanical self-healing characteristics, dog-bone samples are prepared according to ASTM D 638-V from a film having a thickness of 0.6 mm. The dog bone samples include an original sample and a cracked sample. The cracked sample is a sample which is partially cut in ⅔ of a thickness of the dog-bone sample, and the original sample is a sample which is not cracked.

The mechanical self-healing characteristics are measured by simultaneously heat-treating the original sample and the cracked sample on a hot plate at 60° C. for 2 hours and being allowed to stand at room temperature for 24 hours to perform a tensile test by UTM. The method and the device for the measurement are same as in Evaluation I, and Calculation Equation of the self-healing efficiency is as follows:

Self-healing Efficiency (%)=[(tensile stress or elastic modulus of self-healing elastomer)/(tensile stress or elastic modulus of original elastomer)]

The results are shown in Table 2.

TABLE 2

| | Self-healing efficiency (%) |
|---|---|
| Preparation Example 1 | tensile stress reference: 100% elastic modulus reference: 100% |
| Preparation Example 2 | tensile stress reference: 98% elastic modulus reference: 87% |
| Preparation Example 3 | tensile stress reference: 96% elastic modulus reference: 94% |
| Preparation Example 4 | tensile stress reference: 91% elastic modulus reference: 100% |

Referring to Table 2, it is confirmed that the supramolecular structures according to Preparation Examples show a self-healing efficiency in greater than or equal to about 90%, and thus it is confirmed that they have excellent mechanical self-healing characteristics.

Evaluation III

The supramolecular structures according to Preparation Examples are evaluated for optical self-healing characteristics.

The optical self-healing characteristics are analyzed using a film having a thickness of 0.6 mm by a BX53M optical microscope of 200* magnifications manufactured by Olympus. ⅔ of the film is partially cut, and then an image before the healing is taken by an optical microscope and heated using a hot plate at 45° C., and an image after the healing is taken to evaluate the optical self-healing characteristics.

Figure 10:
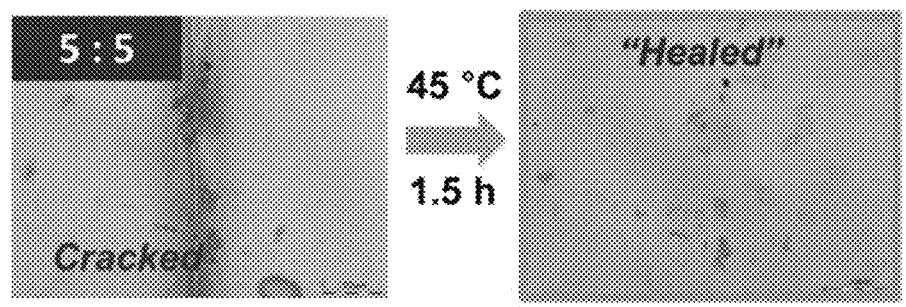
FIGS. 10 to 12 are photographs showing self-healing characteristics of the supramolecular structures according to Preparation Examples 1, 3, and 4 when they are damaged and then allowed to stand at 45° C. for 1.5 hours or 2 hours.
Figure 11:
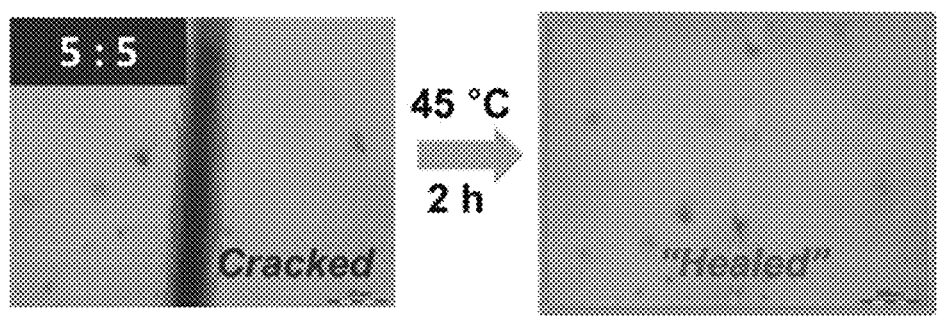
Figure 12:
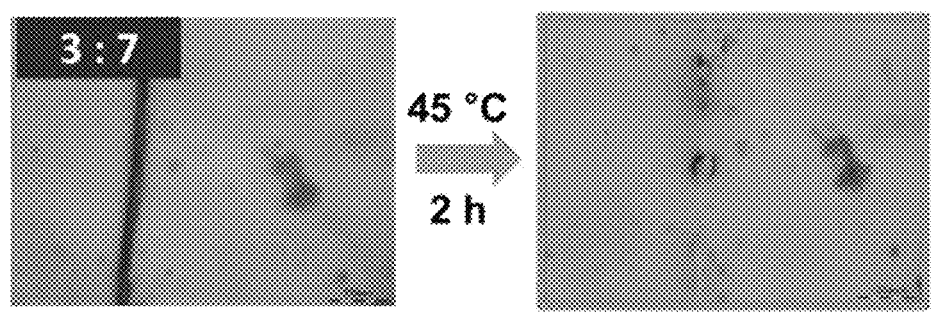

FIGS. 10 to 12 are images showing optical self-healing characteristics of the supramolecular structures according to Preparation Examples 1, 3, and 4 when they are damaged and then allowed to stand at 45° C. for 1.5 hours or 2 hours.

Referring to FIGS. 10 to 12, it is confirmed that the supramolecular structures according to Preparation Examples show good optical self-healing characteristics.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A supramolecular structure, comprising
a plurality of first oligomers having a zwitterion at the terminal end, and
a plurality of second oligomers having a hydrogen-bondable functional group at the terminal end,
wherein a supramolecule comprising the plurality of first oligomers and a supramolecule comprising the plurality of second oligomers form a three-dimensional network structure.

2. The supramolecular structure of claim 1, wherein the first oligomers are non-linear oligomers, and
the second oligomers are linear oligomers.

3. The supramolecular structure of claim 2, wherein the zwitterion is positioned at each terminal end of the non-linear oligomers, and
the hydrogen-bondable functional group is positioned at both terminal ends of the linear oligomers.

4. The supramolecular structure of claim 1, wherein the first oligomers have a quaternary carbon structure.

5. The supramolecular structure of claim 4, wherein the first oligomers are represented by Chemical Formula 1:

[Chemical Formula 1]

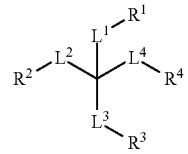

wherein, in Chemical Formula 1,
$L^1$ to $L^4$ are independently a single bond or a substituted or unsubstituted C1 to C10 alkylene group, and
$R^1$ to $R^4$ are independently a substituted or unsubstituted C1 to C10 alkyl group, a substituted or unsubstituted C6 to C30 aryl group, or a group represented by Chemical Formula A, provided that at least one of $R^1$ to $R^4$ is a group represented by Chemical Formula A,

[Chemical Formula A]

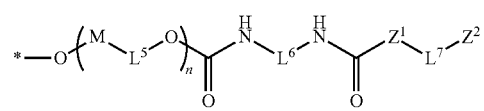

wherein, in Chemical Formula A,
M is C(=O), C(=O)O, or OC(=O),
$L^5$ to $L^7$ are independently a single bond or a substituted or unsubstituted C1 to C10 alkylene group,
one of $Z^1$ and $Z^2$ is a cationic functional group,
the other of $Z^1$ and $Z^2$ is an anionic functional group, and
n is 5 to 30.

6. The supramolecular structure of claim 5, wherein the cationic functional group is one of imidazolium ion, an ammonium salt ion ($NH_4^+$), and benzimidazolium ion, and the anionic functional group is one of $SO_3^-$, $PO_3^{2-}$, and $COO^-$.

7. The supramolecular structure of claim 5, wherein Chemical Formula A is represented by Chemical Formula A-1:

[Chemical Formula A-1]

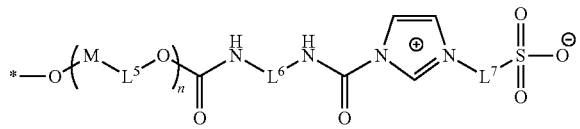

wherein, in Chemical Formula A-1,

M is C(=O), C(=O)O, or OC(=O), $L^5$ to $L^7$ are independently a single bond or a substituted or unsubstituted C1 to C10 alkylene group, and n is 5 to 30.

8. The supramolecular structure of claim 1, wherein the second oligomers have a quadruple hydrogen-bondable functional group.

9. The supramolecular structure of claim 8, wherein the quadruple hydrogen-bondable functional group is represented by Chemical Formula B:

[Chemical Formula B]

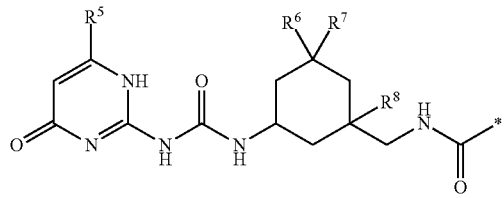

wherein, in Chemical Formula B, $R^5$ to $R^8$ are independently hydrogen, a substituted or unsubstituted C1 to C10 alkyl group, or a substituted or unsubstituted C6 to C30 aryl group.

10. The supramolecular structure of claim 9, wherein the second oligomers are represented by Chemical Formula 2:

11. The supramolecular structure of claim 1, wherein the first oligomers and the second oligomers are included in a weight ratio of about 1:9 to about 9:1.

12. A self-healing elastomer comprising the supramolecular structure of claim 1.

13. The self-healing elastomer of claim 12, wherein the self-healing elastomer satisfies self-healing efficiency of greater than or equal to about 90% at about 40° C. to about 60° C. and a tensile stress of about 0.3 MPa to about 3 MPa simultaneously.

14. A self-healing film comprising the self-healing elastomer of claim 12.

15. An electronic device comprising the self-healing film of claim 14.

16. A method of manufacturing a supramolecular structure, comprising:
preparing a plurality of first oligomers having a zwitterion at the terminal end,
preparing a plurality of second oligomers having a hydrogen-bondable functional group at the terminal end, and
mixing the plurality of the first oligomers and the plurality of second oligomers to form a three-dimensional network structure comprising a supramolecule comprising the plurality of the first oligomers and a supramolecule comprising the plurality of the second oligomers.

17. The method of claim 16, wherein the preparing of the plurality of first oligomers comprises
preparing an oligomer having a quaternary carbon structure,
bonding one of a cationic functional group and an anionic functional group with the terminal end of the oligomer having the quaternary carbon structure to prepare an ionic bonding derivative, and
bonding the other of the cationic functional group and the anionic functional group with the ionic bonding derivative to prepare first oligomers having a zwitterion at the terminal end.

[Chemical Formula 2]

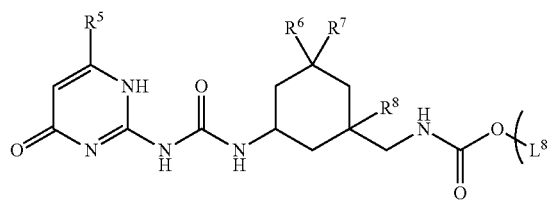 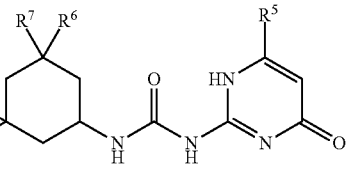

wherein, in Chemical Formula 2,

Q is C(=O), C(=O)O, or OC(=O), $L^8$ and $L^9$ are independently a single bond or a substituted or unsubstituted C1 to C10 alkylene group, $R^5$ to $R^8$ are independently hydrogen, a substituted or unsubstituted C1 to C10 alkyl group, or a substituted or unsubstituted C6 to C30 aryl group, and m is 5 to 60.

18. The method of claim 17, wherein the preparing of the plurality of the second oligomers comprises
preparing a compound having a quadruple hydrogen-bondable functional group, and
introducing the quadruple hydrogen-bondable functional group at both terminal ends of a linear oligomer.

19. The method of claim 16, wherein the mixing of the first oligomers and the second oligomers comprises mixing the first oligomers and the second oligomers in a weight ratio of about 1:9 to about 9:1.

* * * * *